United States Patent
Satoh et al.

(10) Patent No.: US 10,319,585 B2
(45) Date of Patent: Jun. 11, 2019

(54) FILM FORMING METHOD

(71) Applicant: TOKYO ELECTRON LIMITED, Tokyo (JP)

(72) Inventors: Kohichi Satoh, Nirasaki (JP); Shinya Okabe, Nirasaki (JP); Nagayasu Hiramatsu, Nirasaki (JP); Motoko Nakagomi, Nirasaki (JP); Yuji Kobayashi, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 15/722,343

(22) Filed: Oct. 2, 2017

(65) Prior Publication Data
US 2018/0102244 A1 Apr. 12, 2018

(30) Foreign Application Priority Data
Oct. 7, 2016 (JP) .................. 2016-199162

(51) Int. Cl.
*H01L 21/4763* (2006.01)
*H01L 21/44* (2006.01)
*H01L 21/02* (2006.01)
*H01J 37/32* (2006.01)
*C23C 16/02* (2006.01)
(Continued)

(52) U.S. Cl.
CPC ...... *H01L 21/0228* (2013.01); *C23C 16/0281* (2013.01); *C23C 16/045* (2013.01); *C23C 16/06* (2013.01); *C23C 16/45512* (2013.01); *C23C 16/45536* (2013.01); *C23C 16/45574* (2013.01); *C23C 16/5096* (2013.01); *H01J 37/32* (2013.01); *H01L 21/02274* (2013.01); *H01J 37/26* (2013.01); *H01J 2237/3321* (2013.01)

(58) Field of Classification Search
CPC .......... H01L 21/0228; H01L 21/76846; H01L 21/76832; H01L 21/02274
USPC ................ 438/648, 650, 676, 685
See application file for complete search history.

(56) References Cited

U.S. PATENT DOCUMENTS

| | | | | |
|---|---|---|---|---|
| 2005/0212429 A1* | 9/2005 | Aoki | ........................ | H01J 9/02 313/587 |
| 2009/0283038 A1* | 11/2009 | Gunji | ...................... | C23C 16/16 118/722 |
| 2012/0315404 A1* | 12/2012 | Li | .......................... | C23C 16/12 427/569 |

FOREIGN PATENT DOCUMENTS

| | | |
|---|---|---|
| JP | 2000-124463 A | 4/2000 |
| JP | 2008-537979 A | 10/2008 |

(Continued)

*Primary Examiner* — Hsien Ming Lee
(74) *Attorney, Agent, or Firm* — Nath, Goldberg & Meyer; Jerald L. Meyer

(57) ABSTRACT

A film forming method of forming a film containing a metal element on a substrate using a source gas containing the metal element and a reactant gas that reacts with the source gas, which includes: forming a lower layer film containing the metal element on a surface of the substrate through a plasma CVD process by supplying the source gas into a process container and plasmarizing the source gas; and subsequently, laminating an upper layer film containing the metal element on the lower layer film by a plasma ALD process which alternately performs an adsorption step of supplying the source gas into the process container to adsorb the source gas onto the surface of the substrate with the lower layer film formed thereon, and a reaction step of supplying the reactant gas into the process container and plasmarizing the reactant gas.

5 Claims, 11 Drawing Sheets

(51) Int. Cl.
*C23C 16/04* (2006.01)
*C23C 16/06* (2006.01)
*C23C 16/455* (2006.01)
*C23C 16/509* (2006.01)
*H01J 37/26* (2006.01)

(56) References Cited

FOREIGN PATENT DOCUMENTS

| | | | |
|---|---|---|---|
| JP | 2010-199449 A | 9/2010 |
| KR | 10-1999-0030575 A | 5/1999 |
| KR | 10-2006-0041661 A | 5/2006 |

* cited by examiner

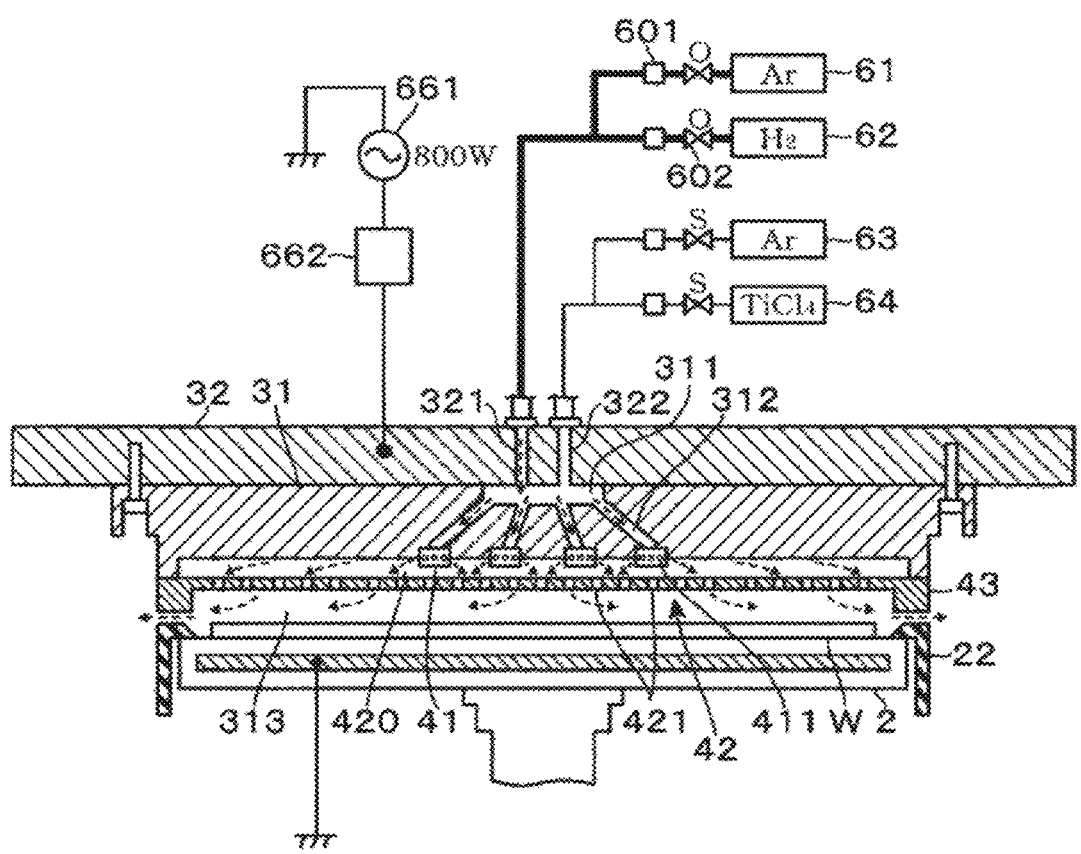

Example 1

Comparative example 1-1

FILM FORMING METHOD

CROSS-REFERENCE TO RELATED APPLICATION

This application is based upon and claims the benefit of priority from Japanese Patent Application No. 2016-199162, filed on Oct. 7, 2016, the entire contents of which are incorporated herein by reference.

TECHNICAL FIELD

The present disclosure relates to a technology for forming a film on a surface of a substrate.

BACKGROUND

In a process of manufacturing a semiconductor device, an Atomic Layer Deposition (ALD) method and a Molecular Layer Deposition (MLD) method is used to form a film containing metal on a surface of a semiconductor wafer (hereinafter). The ALD method includes alternately supplying a source gas containing metal and a reactant gas reacting with the source gas to a wafer on which a film is to be formed, and depositing the metal on the surface of the wafer to form a metal film. The MLD method includes forming a film of a compound containing metal. Hereinafter, in the present application, the ALD method and the MLD process will be collectively referred to as an "ALD process".

For example, a plasma ALD method has been used which facilitates action of a source gas (a first process material) with a plasmarized reactant gas (a second process material).

The ALD method is a film forming method which is capable of forming a film on the surface of a wafer having a stereoscopic structure at a more uniform thickness, thus providing good step coverage. Therefore, the present inventors of the present disclosure have examined, for example, the use of a plasma ALD method as a method for forming a metal film such as a Ti film inside a contact hole formed in an insulation layer.

Further, the present inventors focused on the surface roughness of a film (hereinafter, referred to as "roughness") as an indicator for determining whether an electrical characteristic of a film obtained using the plasma ALD method is good or bad.

In addition, a resistance element manufacturing technology has been used to form a first resistance layer of tantalum nitride (TaN) by a thermal Atomic Layer Deposition (thermal ALD) method, followed by forming a second resistance layer of TaN by a plasma ALD method. However, this technology does not disclose a method for forming a film while focusing on the improvement of roughness.

SUMMARY

Some embodiments of the present disclosure provide a film method capable of forming a film having low surface roughness.

According to one embodiment of the present disclosure, there is provided a film forming method of forming a film containing a metal element on a substrate using a source gas containing the metal element and a reactant gas that reacts with the source gas, the method including: forming a lower layer film containing the metal element on a surface of the substrate through a chemical vapor deposition process (plasma CVD process) by supplying the source gas into a process container and plasmarizing the source gas, the substrate on which a film is to be formed being disposed inside the process container; and subsequently, laminating an upper layer film containing the metal element on the lower layer film by an atomic layer deposition process (plasma ALD process) which alternately performs an adsorption step of supplying the source gas into the process container to adsorb the source gas onto the surface of the substrate with the lower layer film formed thereon, and a reaction step of supplying the reactant gas into the process container and plasmarizing the reactant gas so that the plasmarized reactant gas reacts with the source gas adsorbed onto the surface of the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7 is a view illustrating a second operation of the film forming apparatus in a plasma ALD process.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Prior to describing a film forming method according to an embodiment of the present disclosure, the tendency of roughness of a film formed by a plasma ALD process, which has been practiced by the present inventors, will be described with reference to FIG. 1 and FIGS. 2A to 2C.

Figure 1:
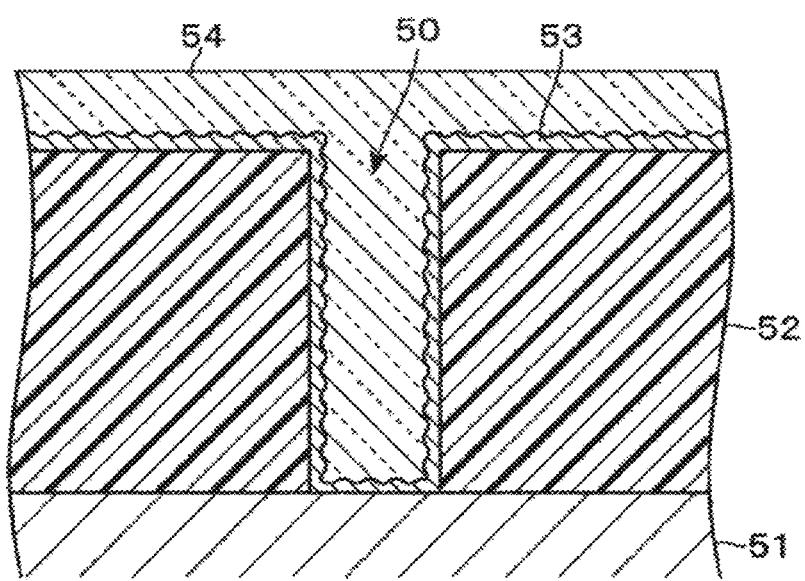
FIG. 1 illustrates an example of a structure of a semiconductor device to which a film forming method according to the present embodiment is applied.

FIG. 1 shows an example of a general device structure in the course of manufacturing a semiconductor device. The device illustrated in FIG. 1 has a structure in which a silicon nitride (SiN) film 52 as an insulation film is laminated on an upper surface of a Si substrate 51 as a wafer W, a contact hole 50 is formed in the SiN film 52, a titanium film 53 as a barrier film is formed on the SiN film 52 and inside the contact hole 50, a tungsten W film 54 is laminated on the titanium film 53, thus filling the interior of the contact hole 50 with tungsten. The contact hole 50 serves to connect a wiring of a layer formed above the SiN film 52 and the Si substrate 51.

Further, in a semiconductor device having a multilayer wiring structure, there may be a case in which a via hole through which wirings are connected to each other are formed in an interlayer insulation film laminated on the aforementioned wiring, and a Ti film as a barrier film or the like is formed inside the via hole (the multilayer wiring structure is not illustrated).

In recent years, the contact hole 50 or a via hole (not shown) tends to have a higher aspect ratio (a ratio of a depth to an opening diameter of the contact hole 50 or the via hole). Meanwhile, conventionally, a Physical Vapor Deposition (PVD) method, which has been used to form a metal film such as the Ti film 53, fails to obtain a film having good step coverage. Thus, the method is not suitable for formation of a film inside a hole having a high aspect ratio.

In this regard, the present inventors have examined a method for forming the Ti film 53 using a plasma ALD process in which a film having good step coverage is obtained.

In the formation of the Ti film 53, a titanium tetrachloride ($TiCl_4$) gas was used as a source gas containing a Ti element which is a source material of the formed Ti film, and a mixed gas of a hydrogen ($H_2$) gas and an argon (Ar) gas was used as a reactant gas that reacts with the source gas. Further, the Ti film 53 was obtained by a plasma ALD process which alternately repeats an adsorption step of supplying a source gas into a process container having a wafer W accommodated therein, on which a film is to be formed, and adsorbing the source gas onto a surface of the wafer W, and a reaction step of supplying a reactant gas into the process container and turning the reactant gas into plasma so that the reactant gas in a plasma state reacts with the source gas adsorbed onto the surface of the wafer W.

The Ti film 53 formed by the plasma ALD process was formed on the entire interior of the contact hole 50 having a high aspect ratio and thus good step coverage was obtained. Meanwhile, the present inventors found that the roughness of the Ti film 53 is increased as compared with a plasma CVD process in which a mixed gas of a source gas and a reactant gas is turned into plasma inside a process container to deposit a Ti film on the surface of a wafer (see Comparative Example 1-1 described below).

The present inventors understood that the use of the Ti film 53 having high roughness results in deterioration of electrical characteristics, for example, an increase in contact resistance between the Si substrate 51 and the wiring via the contact hole 50.

In this regard, the present inventors developed a method for improving the roughness of the Ti film 53 while employing the plasma ALD process which provides good step coverage, and examined a mechanism of increasing the roughness of the Ti film 53 formed by the plasma ALD process.

Figure 2A:
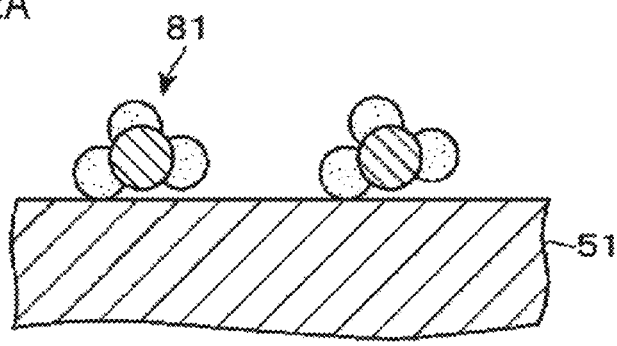
FIGS. 2A to 2C are schematic diagrams of a surface of a substrate when forming a film using only a plasma ALD process.
Figure 2B:
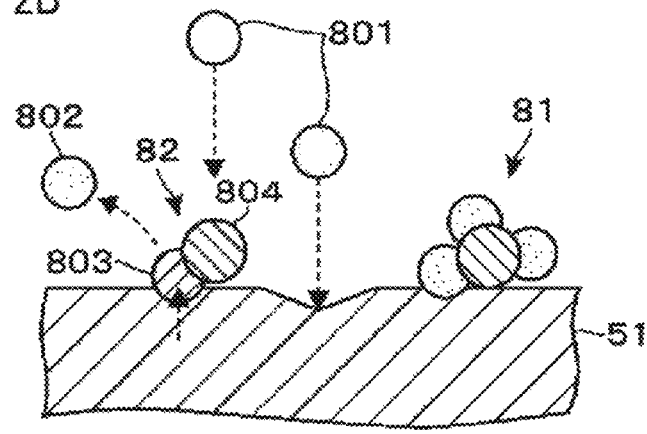
Figure 2C:
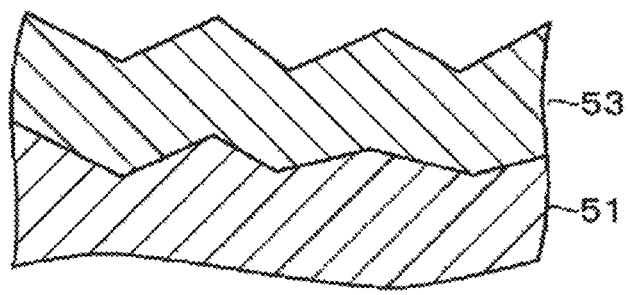

FIGS. 2A to 2C schematically illustrate a mechanism which is estimated to be a reason for why the roughness of the Ti film 53 formed by the plasma ALD process increases.

FIG. 2A shows a state in which a $TiCl_4$ gas 81 as a source gas is adsorbed onto the surface of the Si substrate 51 (the wafer W) by performing a adsorption step.

In general, the ALD process is a method for adsorbing a source gas onto a surface of a wafer W, on which a film is to be formed, to form a uniform molecular layer, followed by making the molecular layer react with a reactant gas, followed by depositing a layer of atoms or molecules obtained by the reaction to obtain a film having a uniform thickness.

However, there is a gap between the $TiCl_4$ gases 81 adsorbed onto the surface of the actual Si substrate 51 after the adsorption step. Thus, a portion of the surface of the Si substrate 51 remains exposed.

When a subsequent reaction step is performed in this state, the $TiCl_4$ gas 81 is reduced by active species such as H radicals 801 generated by turning the reactant gas into plasma, so that titanium metal (Ti) 804 as a film material is obtained.

Meanwhile, as illustrated in FIG. 2B, when the exposed surface of the Si substrate 51 is exposed to plasma of a reactant gas and the H radicals 801 or the like act on the Si substrate 51, a portion of the surface of the Si substrate 51 is scraped, thereby forming a concave portion. Further, a portion of the Ti 804 obtained by the reduction of the $TiCl_4$ gas 81 is coupled with Si 803 constituting the Si substrate 51 to partially generate a compound such as TiSi 82 that is stable with respect to plasma. Further, reference numeral 802 is Cl or HCl which is reduced and removed from the $TiCl_4$ gas 81.

As a result, concave portions formed by scraping the Si substrate 51 and convex portions formed by a compound (TiSi 82 in the example shown in FIG. 2B) partially generated on the surface of the Si substrate 51 are present on the surface of the Si substrate 51.

It is estimated that, if the Ti film 53 is formed by laminating, by a plasma ALD process, the titanium metal on the surface of the Si substrate 51 having the concave and convex portions formed thereon, the concave and convex portions formed on the Si substrate 51 as a underlayer are also reflected the surface of the Ti film 53, which causes concave and convex portions to be similarly formed on the surface of the Ti film 53 as illustrated in FIG. 2C, thereby increasing the roughness of the Ti film 53.

It is considered that, according to a mechanism related to the increase in the roughness of the Ti film 53 estimated as above, in an initial step of starting the lamination of the Ti film 53 on the surface of the Si substrate 51, maintaining the surface of the Si substrate 51 as flat as possible is a critical factor in limiting an increase in the roughness of the Ti film 53 laminated on the Si substrate 51.

Therefore, according to the film forming method of the present embodiment, in the initial step of forming the Ti film 53, a plasma CVD process is performed to form a lower layer film 53A (to be described later) of titanium metal, and then a plasma ALD process is performed to laminate an upper layer film 53B (to be described later) made of the same material as that of the lower layer film 53A on the lower layer film 53A. In this way, the Ti film 53 having good coverage is formed while limiting the increase in the roughness of the Ti film 53.

Hereinafter, an example of the configuration of a film forming apparatus for implementing the film forming method will be described with reference to FIG. 3.

Figure 3:
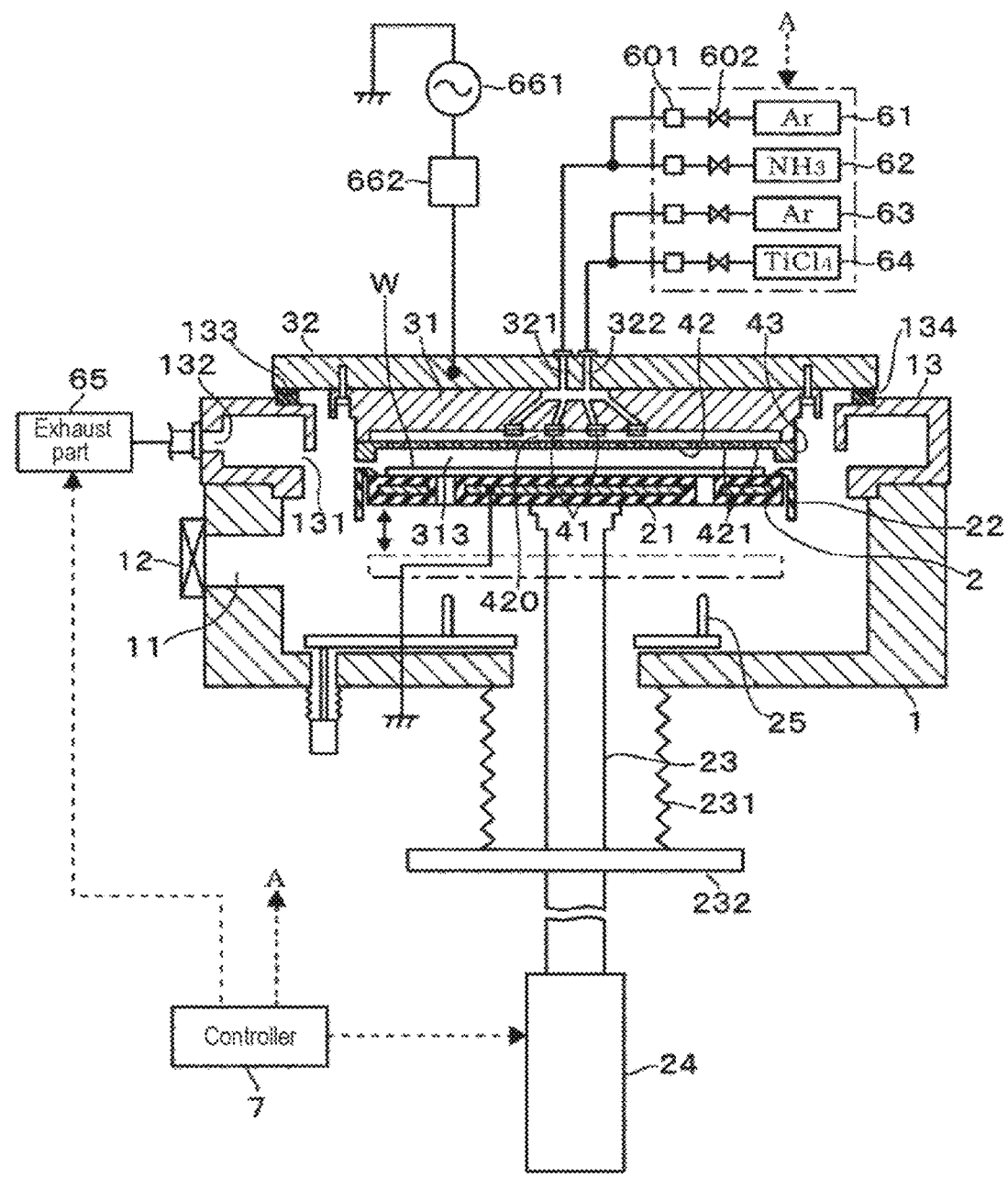
FIG. 3 is a longitudinal sectional side view of a film forming apparatus for implementing a film forming method of the present embodiment.

As illustrated in FIG. 3, the film forming apparatus has a configuration in which a mounting table 2 on which a wafer W is mounted is installed inside a process container 1 as a metal vacuum container. A loading/unloading port 11 through which the wafer W is loaded into or unloaded from the process container 1 and a gate valve 12 configured to open/close the loading/unloading port 11, are installed in a lateral surface of the process container 1.

A metallic exhaust duct 13 formed by bending a rectangular duct in an annular shape is stacked on a body of the process container 1. A slit-shaped opening 131 through which a gas flowing out of a process space 313 is exhausted, is formed in an inner peripheral surface of the exhaust duct 13. An exhaust part 65 including a vacuum pump or the like is connected to an exhaust port 132 formed in an outer wall surface of the exhaust duct 13. A combination of the exhaust port 132 and the exhaust part 65 constitutes a vacuum exhaust part which evacuates the inside of the process space 313.

The mounting table 2 is disposed inward of the exhaust duct 13 and is configured by a circular plate made of ceramic or metal. The mounting table 2 has a heater (not illustrated) embedded therein to heat the wafer W at a film formation temperature having the range of, for example, 350 to 550 degrees C. Further, the mounting table 2 may include an electrostatic chuck (not illustrated) installed therein to fix the wafer W within a predetermined mounting region. Further, a cover member 22 configured to cover an outer peripheral portion of the mounting region and a lateral peripheral surface of the mounting table 2 in the circumferential direction, is installed in the mounting table 2.

The mounting table 2 is connected to an elevating mechanism 24 via a support member 23 passing through a bottom surface of the process container 1 and a plate-shaped support table 232. The elevating device 24 moves the mounting table 2 up and down between a transfer position of the wafer W (described in dash-dot-dash line in FIG. 3) and a process position at which a film is formed on the wafer W.

The process container 1 is air-tightly sealed by a bellows 231 surrounding the support member 23 and connected to the support table 232. Further, a plurality of vertically-movable support pins 25 is installed under the mounting table 2. The plurality of support pins 25 protrude from the upper surface of the mounting table 2 via respective through-holes formed in the mounting table 2, thereby lifting the wafer W.

A support plate 32 made of a metal disc member is installed on a top surface of the exhaust duct 13. A ring-shaped insulation member 134 is disposed between the exhaust duct 13 and the support plate 32. The inside of the process container 1 is air-tightly sealed by an O-ring 133 received in a groove formed in an upper surface of the insulation member 134. Further, the support plate 32 is insulated from the exhaust duct 13 by the insulation member 134. A ceiling plate member 31 made of metal is supported by and fixed to a lower surface of the support plate 32.

The ceiling plate member 31 has a concave portion formed in a lower surface thereof. A central region of the concave portion is flat. A metallic shower head 42 is installed below the ceiling plate member 31 to cover the entire lower surface of the ceiling plate member 31. The shower head 42 includes a flat circular plate facing the mounting table 2 and a ring-shaped protrusion 43 formed in a peripheral portion of the circular plate to protrude downward.

When the mounting table 2 is lifted up to the process position, a lower end of the ring-shaped protrusion 43 is positioned to face the upper surface of the cover member 22 in the mounting table 2 through a gap. A space, which is surrounded by the lower surface of the shower head 42, the ring-shaped protrusion 43 and the upper surface of the mounting table 2, is the process space 313 in which a film is formed on the wafer W.

Further, a space between the concave portion of the ceiling plate member 31 and the shower head 42 is defined as a diffusion space 420 where a gas diffuses. A plurality of gas discharge holes 421 is formed in the entire surface of the shower head 42. A reactant gas can be supplied toward the wafer W through the gas discharge holes 421.

Figure 5:
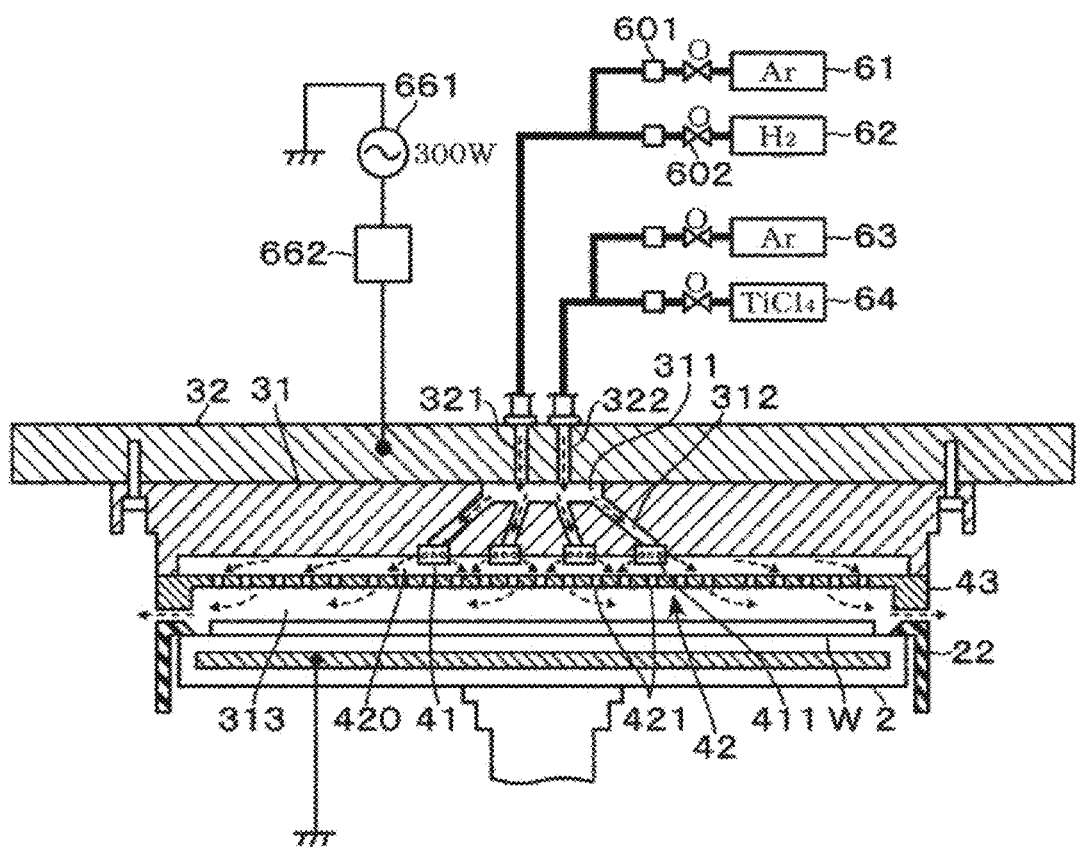
FIG. 5 is a view illustrating an operation of the film forming apparatus in a plasma CVD process.

Further, a plurality of gas dispersion parts 41 is arranged inside the diffusion space 420, for example, in a concentric circle shape. As illustrated in FIGS. 3 and 5, and the like, each of the gas dispersion parts 41 has a configuration in which a plurality of gas discharge holes 411 is formed along the circumferential direction in a lateral surface of a flat cylindrical member with its upper surface opened and its lower surface closed. The openings formed in the upper surfaces of the gas dispersion parts 41 are connected to openings of downstream ends of a plurality of gas supply passages 312 formed in the ceiling plate member 31, respectively.

Each of the gas supply passages 312 is connected to a diffusion space 311 which is a buffer chamber defined between the upper surface of the ceiling plate member 31 and the lower surface of the support plate 32.

The support plate 32 includes a reactant gas supply passage 321 and a source gas supply passage 322 formed therein. The reactant gas supply passage 321 is formed to supply a reactant gas containing a hydrogen gas and a plasma-generating argon gas to the diffusion space 311. Similarly, the source gas supply passage 322 is formed to supply a source gas containing a titanium chloride gas and a dilution-purpose argon gas to the diffusion space 311.

The reactant gas supply passage 321 is connected to an argon gas supply part 61 and a hydrogen gas supply part 62 through brandied pipes. Further, the source gas supply passage 322 is connected to an argon gas supply part 63 and a titanium chloride gas supply part 64 through branched pipes. An opening/closing valve 602 configured to perform the supply and cutoff of a gas, and a flow rate regulator 601 configured to adjust the supply amount of gas are installed in each of the branched pipes. Further, for the sake of convenience in illustration, while in FIG. 3, the argon gas supply parts 61 and 63 has been described to be individually installed, a common argon gas supply part may be used.

Further, a high-frequency power supply 661 for forming plasma is connected to the support plate 32 via a matcher 662. The high-frequency power supply 661 supplies, for example, a high-frequency power of 13.56 MHz. A combination of the support plate 32, the ceiling plate member and shower head 42, which are made of a metal member and coupled to one another, constitutes an upper electrode for forming plasma.

Meanwhile, a lower electrode 21 constituting a parallel plate electrode between the mounting table 2 and the upper electrode is installed in the mounting table 2. For example, in the case where the mounting table 2 is made of ceramic, a circular plate-shaped lower electrode 21 is embedded in the mounting table 2. In the film forming apparatus of the present embodiment, the lower electrode 21 is grounded (FIG. 3). Further, in the case where the mounting table 2 is made of metal, the body of the mounting table 2 may be grounded and the mounting table 2 itself may be employed as the lower electrode (this configuration is not illustrated herein).

In the above configuration, by applying the high-frequency power between the lower electrode 21 of the mounting table 2 side and the upper electrode, which is composed of the support plate 32, the ceiling plate member 31 and the shower head 42, it is possible to turn a gas inside the diffusion space 420 or the process space 313 into plasma by capacitive coupling. Further, the high-frequency power is not limited to being applied to the upper electrode but may be applied to the lower electrode 21. In this case, the upper electrode is grounded.

The film forming apparatus is connected to a controller 7 as illustrated in FIG. 3. The controller 7 is configured by, for example, a computer including a Central Processing Unit (CPU) and a memory part (both not illustrated). The memory part stores a program including a group of commands (instructions) for controlling the film forming method performed by the film forming apparatus, namely a method for supplying a source gas or a reactant gas to the wafer W accommodated in the process container 1 (the process space 313) according to a predetermined sequence or flow rate, and forming plasma of these gases at a predetermined timing to form a Ti film. The program is stored in a memory medium such as a hard disk, a compact disk, magneto-optical disk, a memory card or the like, and is installed in the computer from the memory medium.

Contents of the film forming method performed by the film forming apparatus configured as above will be also described with reference to FIG. 4 to FIGS. 8A to 8D.

First, in the process container 1 which has been previously evacuated by the exhaust part 65, the mounting table 2 is moved down to the transfer position. The gate valve 12 is opened and a transfer arm of a wafer transfer mechanism installed in an external vacuum transfer chamber enters the process container 1. A wafer W on which a film is to be formed is held by the transfer arm. The support pins 25 are moved up to receive the wafer W from the transfer arm. Thereafter, the support pins 25 are moved down so as to mount the wafer W on the mounting table 2 which has been heated by a heater (not illustrated) at a predetermined film formation temperature.

Subsequently, the transfer arm is retracted and the gate valve 12 is closed. The mounting table 2 is moved up to the process position and an internal pressure of the process container 1 is adjusted. Thereafter, the film formation is performed.

Figure 4:
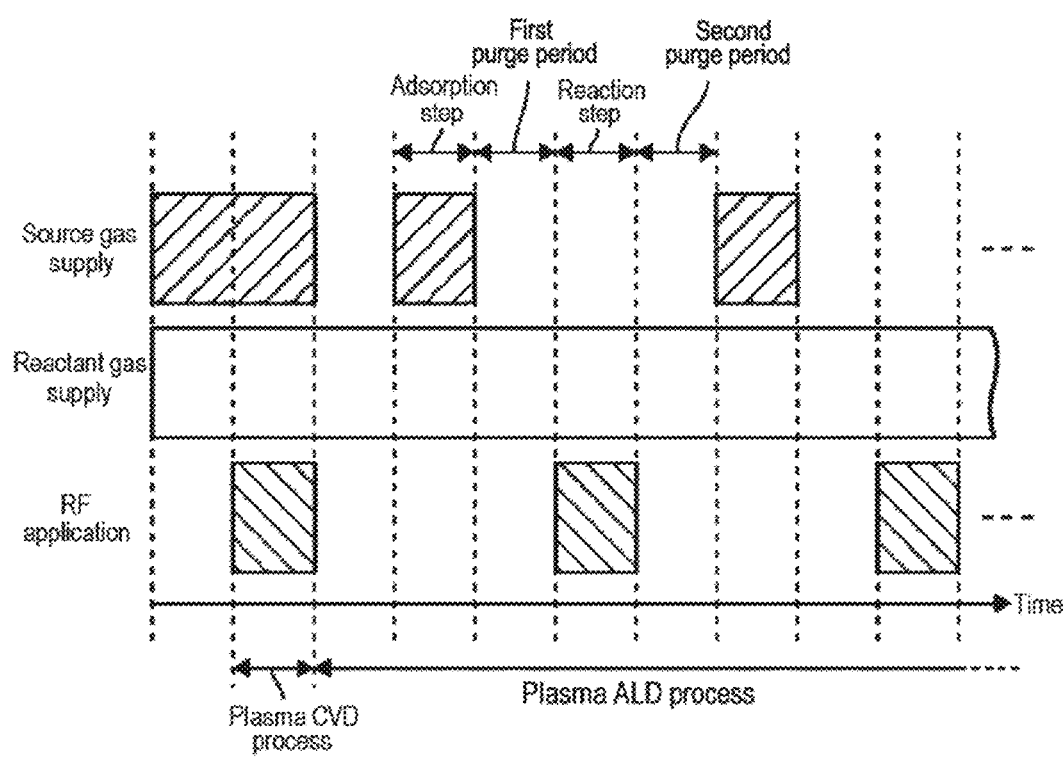
FIG. 4 is a time chart of a film forming process performed in the film forming apparatus.

Here, according to the film forming method of the present embodiment, the Ti film 53 is formed in two divided processes, i.e., a plasma CVD process and a plasma ALD process as illustrated in FIG. 4.

First, as illustrated in FIGS. 4 and 5, in the plasma CVD process, the supply of the source gas through the source gas supply passage 322 and the supply of the reactant gas through the reactant gas supply passage 321 are performed in parallel. The source gas and the reactant gas supplied at predetermined flow rates join inside the diffusion space 311 to form a mixture gas of the source gas and the reactant gas. The mixture gas is introduced into the diffusion space 420 through the gas supply passages 312 and the gas dispersion parts 41.

The mixture gas, which has been introduced into and dispersed in the diffusion space 420, flows into the process space 313 in which the wafer W is disposed, through the gas discharge holes 421 formed in the shower head 42. The mixture gas inside the process space 313 flows along the upper surface of the wafer W mounted on the mounting table 2 outward in the diameter direction of the wafer W. Subsequently, the mixture gas flows toward the exhaust duct 13 through the gap between the cover member 22 and the end of the ring-shaped protrusion 43. The mixture gas flowing into the exhaust duct 13 is discharged outside through the exhaust port 132.

Further, even in an adsorption step or a reaction step of the plasma ALD process described below, various kinds of gases flowing into the diffusion space 311 flow while manifesting the same behavior as that in an example described with reference to FIG. 5.

As illustrated in the time chart of FIG. 4 and FIG. 5, if a predetermined period of time elapses after starting the supply of the source gas and the reactant gas, the high-frequency power supply 661 applies the high-frequency power of 300 W, which falls within the range of 100 to 500 W (described as "RF application" in FIG. 4), so as to plasmarize the mixture gas.

By plasmarizing the mixture gas of the source gas and the reactant gas, active species of titanium tetrachloride or hydrogen are generated in the plasma so that titanium metal particles are obtained by reaction between the active species. The titanium metal particles are deposited on the surface of the Si substrate 51 as the wafer W, thereby forming the lower layer film 53A (in the plasma CVD process; see FIG. 8A).

In the plasma CVD process, energy of plasma is mainly used for a CVD reaction in the respective plasma (a reaction by which titanium metal particles are obtained from active species of titanium tetrachloride or hydrogen). Therefore, in an initial film forming step in which the Si substrate 51 is exposed, by performing the film formation based on the plasma CVD process, it is possible to suppress the surface of the Si substrate 51 from being scraped, or suppress a compound which is stable with respect to plasma generated by a reaction between the Si substrate 51 and the source gas, from being partially produced. This makes it possible to suppress concave and convex portions from being formed on the surface of the Si substrate 51.

Further, the power applied from the high-frequency power supply 661 in the plasma CVD process is less than that in the subsequent plasma ALD process (300 W in the plasma CVD process and 800 W in the plasma ALD process). In a state where the surface of the Si substrate 51 is exposed, by suppressing the plasma-generating energy at a low level, it is possible to suppress concave and convex portions from being formed on the surface of the Si substrate 51.

In the above-described plasma CVD process, the lower layer film 53A having a predetermined thickness of 3 nm or less (for example, 1 nm) is formed. Thereafter, the supply of the source gas and the RF application is stopped and the plasma CVD process is terminated.

In the present embodiment, the supply of the reactant gas is continuously performed so that the reactant gas may be also used as a purge gas for purging the source gas remaining in the process space 313. Further, instead of the reactant gas, an inert gas such as a nitrogen gas may be supplied as a purge gas (it is desirable to select an inert gas which does not react with the lower layer film 53A).

Figure 6:
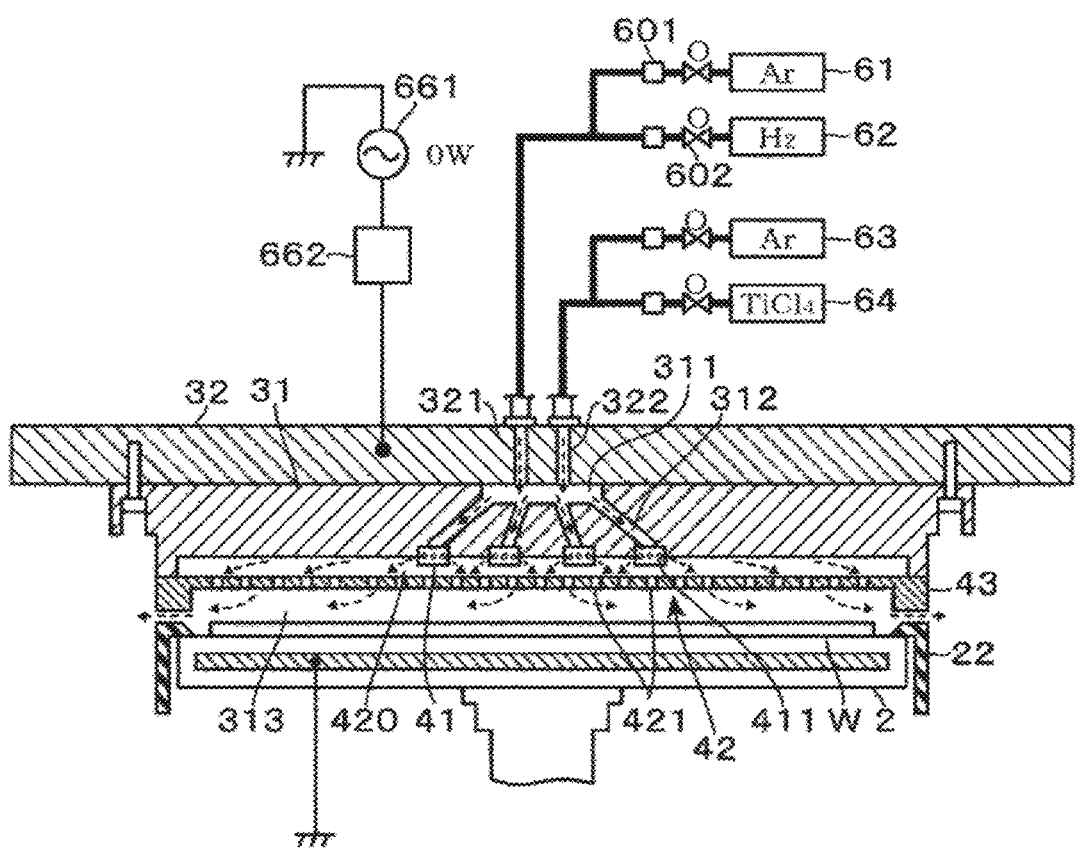
FIG. 6 is a view illustrating a first operation of the film forming apparatus in a plasma ALD process.
Figure 8A:
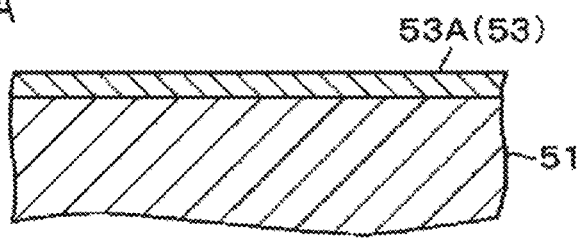
FIGS. 8A to 8D are schematic diagrams of a surface of a substrate when forming a Ti film using a film forming method of the present embodiment.
Figure 8B:
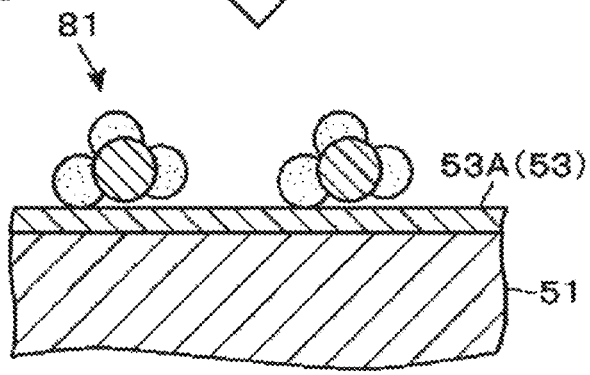

After the source gas inside the process space 313 is exhausted, the supply of the source gas (the $TiCl_4$ gas 81) is resumed so that the source gas (the $TiCl_4$ gas 81) is adsorbed onto the surface of the Si substrate 51 having the lower layer film 53A formed thereon (in an adsorption step illustrated in FIG. 4; see FIGS. 6 and 8B). FIG. 6 shows an example in which the supply of the reactant gas is continuously performed in parallel with the supply of the source gas. However, the supply of the reactant gas may be stopped during the supply of the source gas.

As illustrated in FIG. 8B, the TiCl$_4$ gas 81 in the source gas supplied into the process space 313 is adsorbed onto the surface of the lower layer film 53A formed on the Si substrate 51.

After the adsorption step is performed for a predetermined period of time, the supply of the source gas is stopped but the supply of the reactant gas is continuously performed, thereby purging the source gas remaining in the process space 313 (a first purge period in FIG. 4). After the predetermined period of time elapses and at a timing at which the source gas remaining in the process space 313 is discharged, the high-frequency power supplied from the high-frequency power supply 661 is increased to 800 W within the range of 500 to 1500 W, thus plasmarizing the reactant gas (in a reaction step in FIG. 4; see FIGS. 7 and 8C).

Figure 8C:
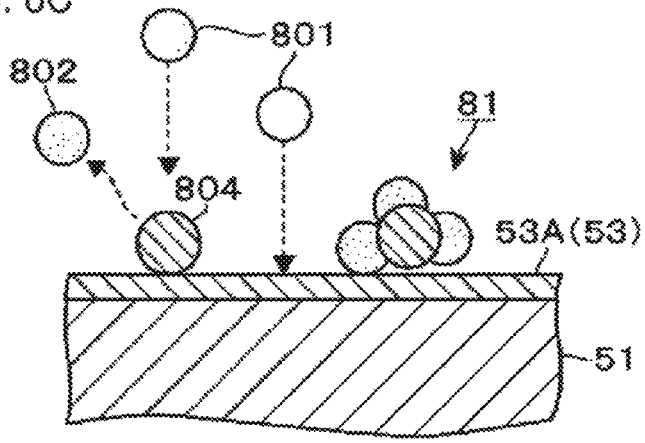
Figure 8D:
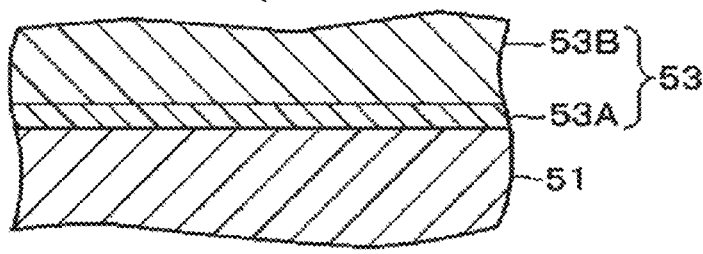

The plasmarization of the reactant gas generates active species such as the H radicals 801. The TiCl$_4$ gas 81 adsorbed onto the surface of the lower layer film 53A is reduced by the active species so that titanium metal is obtained. As illustrated in FIG. 8C, in this reaction step, the surface of the Si substrate 51 remains covered with the lower layer film 53A formed in the plasma CVD process. It is therefore possible to suppress concave portions from being formed on the surface of the Si substrate 51 by scraping the surface of the Si substrate 51, and suppress convex portions from being formed on the surface of the Si substrate 51 due to the partial formation of a compound on the surface of the Si substrate 51, as compared with the case where the plasma ALD process is performed with the surface of the Si substrate 51 exposed (FIG. 2B).

After the reaction step is performed for a predetermined period of time, the supply of the high-frequency power from the high-frequency power supply 661 is stopped and the reaction step is ended. Further, the reactant gas is continuously supplied so as to purge active species of the reactant gas remaining in the process space 313 (in a second purge period in FIG. 4).

In this way, the cycle of "adsorption step→first purge period→reaction step→second purge period→ . . . " illustrated in FIG. 4 is repeatedly performed a predetermined number of times. Thus, the upper layer film 53B having a desired thickness is formed (in the plasma ALD process). Further, the lower layer film 53A formed in the plasma CND process and the upper layer film 53B formed in the plasma ALD process become the Ti film 53 formed by the film forming method of the present embodiment.

In the reaction step of the plasma ALD process, by applying the high-frequency power (for example, 800 W) higher than that in the plasma CVD process, it is possible to make the TiCl$_4$ gas 81 adsorbed onto the surface of the lower layer film 53A, sufficiently react to each other for a short period of time, thus forming the upper layer film 53B at a dense level in a relatively short period of time.

In the plasma CVD process, the lower layer film 53A is formed while suppressing the formation of the concave and convex portions on the surface of the Si substrate 51, and the upper layer film 53B is laminated on the lower layer film 53A. It is therefore possible to obtain the Ti film 53 having low roughness, as compared with the case where the plasma ALD process is performed with the surface of the Si substrate 51 exposed (see Example 1 described below).

In the plasma ALD process, if the lower layer film 53A having a desired thickness is formed by repeating the above-mentioned cycle, for example, several tens of times to several hundreds of times, the supply of the reactant gas as a purge gas is sopped. Thereafter, the mounting table 2 is moved down to the transfer position and the gate valve 12 is opened so as to make the transfer arm enter the process container 1. Further, in the reverse order of the loading operation of the wafer W, the wafer W after the film formation is transferred from the support pins 25 to the transfer arm and is unloaded from the process container 1. The transfer arm waits for loading of a subsequent wafer W.

The film forming method of the present embodiment provides the following effects. The lower layer film 53A including a metal element (the titanium metal in the aforementioned embodiment) is formed on the surface of the Si substrate 51 (the wafer W) by the plasma CVD process. Thereafter, the upper layer film 53B made of the same material as the lower layer film 53A is laminated on the lower layer film 53A by the plasma ALD process. As a result, when the plasma ALD process is performed, since the surface of the Si substrate 51 is covered with the lower layer film 53A, it is possible to suppress concave and convex portions from being formed on the surface of the Si substrate 51 due to the performance of the plasma ALD process. Therefore, it is possible to form the Ti film 53 having low surface roughness.

In the plasma CVD process described above, there has been described an example in which the Ti film 53 is formed using a source gas containing titanium tetrachloride and a reactant gas containing hydrogen. However, in the plasma CND process, it is not necessarily essential that the lower layer film 53A is formed using the reactant gas which generates active species such as the H radicals 801 or the like. For example, by supplying only a source gas containing a titanium tetrachloride gas and a plasma-generating argon gas and plasmarizing the source gas, it is possible to form the lower layer film 53A through the dissolution of the TiCl$_4$ gas 81.

Further, a film formed by the film forming method of the present embodiment is not limited to the Ti film 53 either. For example, it may be possible to form a tantalum metal film (Ta film) using a source gas containing tantalum pentachloride (TaCl$_5$) and a reactant gas containing hydrogen.

Further, a film to be formed is not limited to a metal film but an inorganic film may be formed. For example, a SiO$_2$ film may be formed by the reaction between a source gas containing tetraethyl orthosilicate (TEOS) and a reactant gas containing an ozone gas. Further, a TiN film may be formed by the reaction between a source gas containing titanium tetrachloride and a reactant gas containing ammonia (NH$_3$). Further, as is the case of forming a composite oxide such as strontium titanate (SrTiO$_3$) or the like, it may be possible to combine three or more source gases reactant gases, such as two kinds of source gases (source gases containing strontium and titanium, respectively) and a reactant gas (containing an ozone gas or the like), and to form a film.

In addition, during the plasma CVD process or the plasma ALD process, a method for forming plasma is not limited to the case in which the parallel plate illustrated in FIG. 3 is used. For example, an Inductively Coupled Plasma (ICP) antenna for turning a gas into plasma by inductive coupling or a microwave antenna for turning a gas into plasma by a microwave may be installed at the side of the support plate 32 to plasmarize a gas inside the diffusion space 420 or the process space 313.

Furthermore, the configuration of the film forming apparatus is not limited to a sheet-type film forming apparatus shown in FIG. 3 or the like. For example, it may be possible to use a batch type film forming apparatus, also known as a longitudinal heat treatment apparatus, which performs a plasma CVD process or a plasma ALD process by loading a shelf-shaped wafer boat configured to hold a plurality of wafers that are vertically arranged into a process container made of quartz, and sequentially supplying a source gas, a plasmarized reactant gas or the like into the process container while heating the inside of the process container using an external heater. Further, the film forming method of the present embodiment may be also applied to a semi-hatch type film forming apparatus in which a plurality of wafers W is arranged around a rotation shaft of a rotary table along the circumferential direction of the rotary table, and rotates the rotary table inside a process container having separated process chambers formed therein, wherein a source gas or a plasmarized reactant gas is supplied to each of the separated process chambers, and makes the plurality of wafers W mounted on the rotary table pass through the process chambers, thereby supplying the source gas or the reactant gas to the plurality of wafers W.

EXAMPLES (Experiment 1)

An experiment was conducted to check the roughness of each of Ti films 53 by forming the Ti film 53 on a surface of a Si substrate 51 under various film formation conditions.

A. Experiment Conditions

The sheet-type film forming apparatus illustrated in FIG. 3 was used to form a film by disposing a water W inside an evacuated process container 1, and changing process conditions of a plasma CVD process and a plasma ALD process using a source gas containing titanium tetrachloride and argon gas and a reactant gas containing hydrogen and an argon gas. Based on the results of measuring the surface of a Ti film 53 with an Atomic Force Microscope (AFM), the root mean square (RMS) roughness, the arithmetic mean roughness (Sa), the maximum height roughness (Sz) per unit area in relation to the Ti film 53 formed by each process were obtained.

Example 1

The Ti film 53 was obtained by forming a lower layer film 53A having a thickness of 1 nm in the plasma CVD process (the power applied from the high-frequency power supply 661 was 300 W) and subsequently, forming an upper layer film 53B having a thickness of 5 nm in the plasma ALD process (the applied power was 800 W). The internal pressure of the process container 1 was 1.88 torr (250 Pa) and the film formation temperature was 420 degrees C. Further, the supply flow rate of the source gas was titanium tetrachloride/ argon=14.7 sccm/300 sccm, the supply flow rate of the reactant gas was hydrogen/argon=7,000 sccm/300 sccm. The supply time of the source gas in the adsorption step of the plasma ALD process was 0.05 second, and the application time of the high-frequency power in the reaction step was one second.

Comparative Example 1-1

A Ti film 53 having a thickness of 6 nm was formed only by the plasma ALD process without performing the plasma CVD process. Process conditions of the plasma ALD process were identical to those in Example 1.

Comparative Example 1-2

A Ti film 53 was obtained by forming a lower layer film 53A having a thickness of 1 nm through the plasma ALD process (in which the power applied from the high-frequency power supply 661 was 300 W) instead of the plasma CVD process and subsequently, forming an upper layer film 539 having a thickness of 5 nm under the same conditions as Example 1.

Reference Example 1

A Ti film 53 having a thickness of 6 nm was formed only by the plasma CVD process. Process conditions of the plasma CVD process were identical to those in Example 1 except that the power applied from the high-frequency power supply 661 is 1,500 W. The roughness of Ti films 53, obtained in each Example and each Comparative example, was evaluated with reference to this method in which interaction with the Si substrate 51 (the formation of concave portions caused by scraping the surface of the Si substrate 51 or the formation of convex portions resulting from the formation of a compound on the surface of the Si substrate 51) is weak.

B. Experiment Results

Figure 9A:
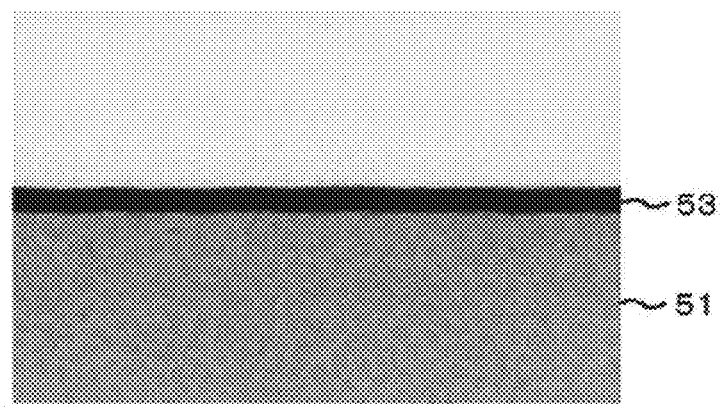
FIGS. 9A and 9B are TEM images showing the formation results of a Ti film in an Example and a Comparative example.
Figure 9B:
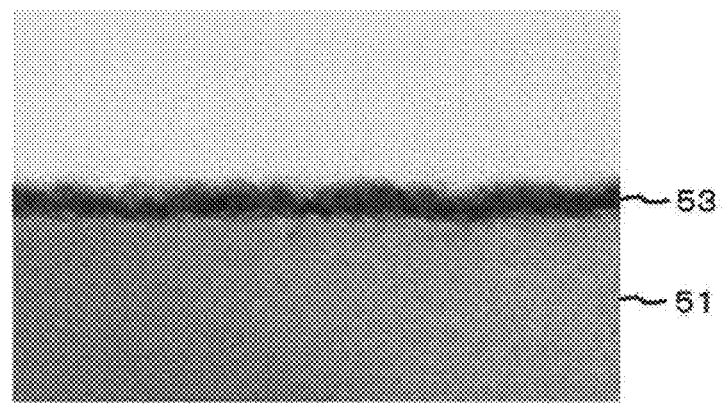

Table 1 shows the calculation result of the roughness of the Ti films 53, obtained in each Example, Comparative example, and Reference example. Further, FIGS. 94 and 9B show the results of photographing the Ti films 53, which are obtained in Example 1 and Comparative example 1-1, using a Transmission Electron Microscope (TEM).

TABLE 1

|  | Root mean square roughness RMS[nm] | Arithmetic mean roughness Sa[nm] | Maximum height roughness Sz[nm] |
| --- | --- | --- | --- |
| Example 1 | 0.38 | 0.30 | 2.87 |
| Comparative example 1-1 | 1.02 | 0.82 | 8.79 |
| Comparative example 1-2 | 0.61 | 0.48 | 4.10 |
| Reference example 1 | 0.42 | 0.34 | 3.55 |

The Ti film 53 in Example 1, which was obtained by forming the lower layer film 53A in the plasma CVD process and subsequently forming the upper layer film 53B in the plasma ALD process, had better roughness than that in the Reference example 1, even when the roughness was calculated in any calculation manner. Further, it can be clearly identified from the TEM image shown in FIG. 9A that it is possible to form the Ti film 53, the surface of which has few concave and convex portions and is smooth.

Meanwhile, the roughness of the Ti film 53 in Comparative example 1-1, which was formed only by the plasma ALD process, was a high level of at least two times that of Reference example 1, even when the roughness was calculated in any calculation manner. Further, the TEM image in FIG. 9B also shows the Ti film 53 having many concave-convex portions and high roughness.

Further, in Comparative Example 1-2 where the lower layer film 53A was formed by the plasma ALD process in which the supplied high-frequency power was reduced to 300 W, the roughness of the film was further improved than that in Comparative Example 1-1 using only the plasma ALD process, even when the roughness was calculated in any calculation manner. However, compared with Reference example 1 which is a determination reference of roughness improvement, the roughness became worse, and thus the degree of the improvement thereof was not enough.

According to the results of the above Example and the Comparative examples, it may be evaluated that the film forming method of the present embodiment in which the Ti film 53 is formed by forming the lower layer film 53A in the plasma CVD process and subsequently forming the upper layer film 53B in the plasma ALD process, is a desirable film forming method in obtaining a film having good roughness.

(Experiment 2)

An experiment was conducted to check the state of a step coverage of a Ti film 53 which is formed on the surface of a Si substrate 51 having a contact hole 50 formed therein.

A. Experiment Conditions

The Ti film 53 was formed on the Si substrate 51 in which the contact hole 50 having an opening diameter of 12 nm and an aspect ratio of 17 is formed, by the same method as Example 1 and Comparative example 1-1. Thereafter, the thickness of the Ti film 53 inside the contact hole 50 was measured.

Example 2

A Ti film 53 was formed by the same method as Example 1.

Reference Example 2

A Ti film 53 was formed by the same method as Comparative example 1-1. As already described, since the plasma ALD process is a film forming method having good step coverage, the step coverage of Example 2 was evaluated on the basis of the Ti film 53 which is obtained by the present method.

B. Experiment Results

Figure 10:
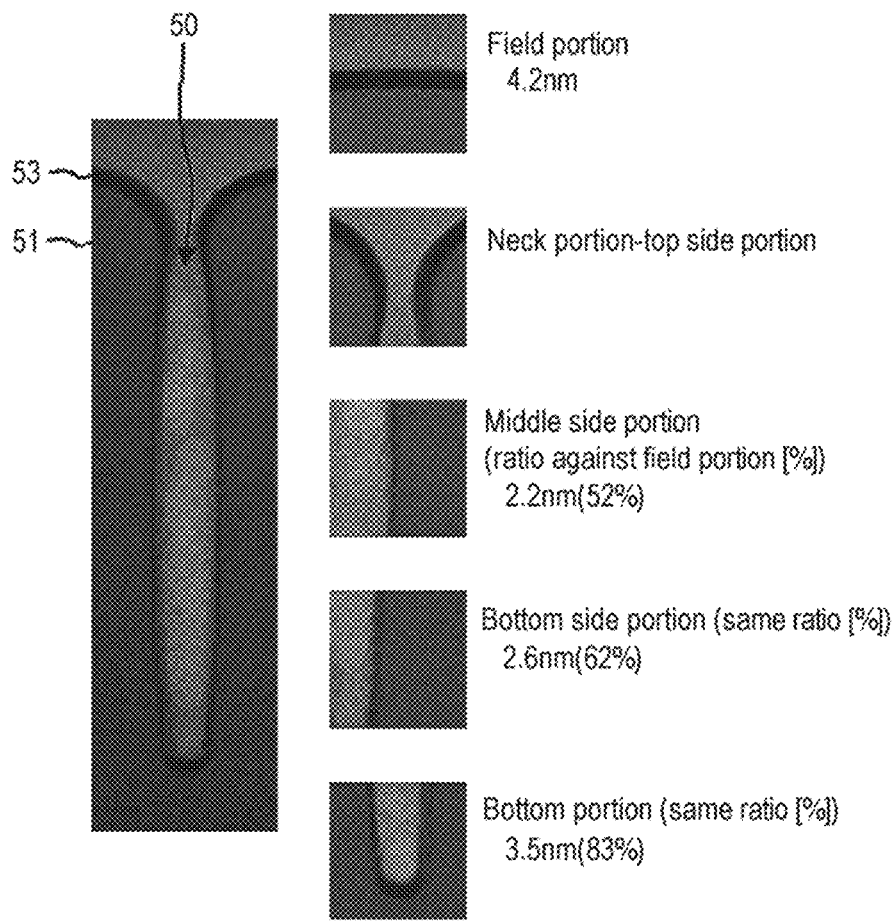
FIG. 10 is a series of images showing the results of the formation of a Ti film within a pattern in an Example.
Figure 11:
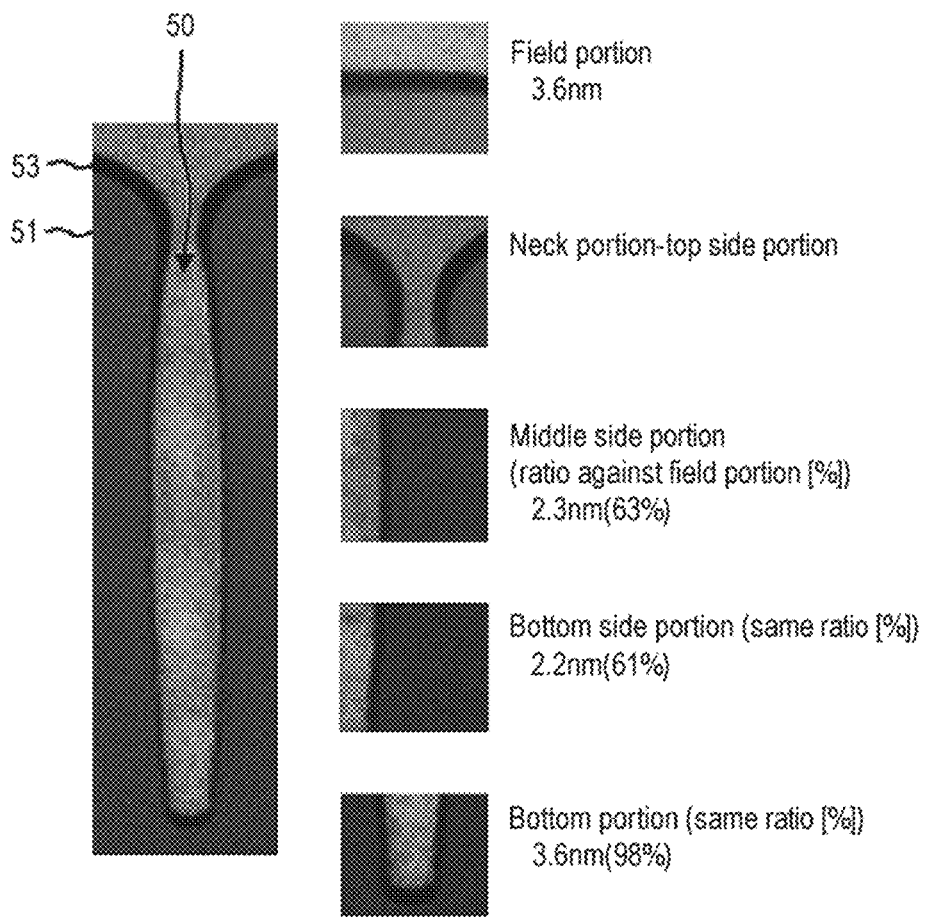
FIG. 11 illustrates images showing the results of the formation of a Ti film within a pattern in a Reference example.

FIG. 10 and FIG. 11 illustrate TEM images in Example 2 and Reference example 2, respectively, in FIG. 10 and FIG. 11, enlarged images of a surface of the Si substrate 51 (field portion), an upper side surface of the contact hole 50 (neck portion-top side portion), a middle side surface of the contact hole 50 (middle side portion), a lower side surface of the contact hole 50 (bottom side portion), and a bottom surface of the contact hole 50 (bottom portion) are shown together. Further, numerical values properly written in the enlarged images indicate the thickness of the Ti film 53 in each portion, and a ratio of the thickness of the Ti film 53 in each portion to the thickness of the Ti film 53 in the field portion, in terms of percentage (%).

According to the result of Example 2, even in the middle side portion and the bottom side portion which tend to decrease in the thickness of the Ti film 53, the Ti film 53 can be formed at a thickness of 52 to 62% of that of the field portion. In this regard, it can be evaluated that the formed Ti film 53 has a thickness sufficient for practical use as compared with the result (61 to 63% of the field part) of Reference example 2 in which a film was formed by only the plasma ALD process. Therefore, it was identified that it is possible to form the Ti film 53 having good coverage even when the film forming method of the present embodiment of forming the lower layer film 53A by the plasma CVD process and subsequently forming the upper layer film 53B by the plasma ALD process, is employed.

According to the present disclosure, a lower layer film containing a metal element is formed on the surface of a substrate in a plasma-based Chemical Vapor Deposition (plasma CVD) process and subsequently, an upper layer film made of the same material as that of the lower layer film is laminated on the lower layer film in a plasma-based Atomic Layer Deposition (plasma ALD) process. As a result, since the surface of the substrate is covered by the lower layer film in the course of performing the plasma ALD process, it is possible to suppress concave and convex portions from being formed on the surface of the substrate due to the performance of the plasma ALD process, it is therefore possible to form a film having a relatively low surface roughness.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method of forming a film containing a metal element on a substrate using a source gas containing the metal element and a reactant gas that reacts with the source gas, the method comprising:

forming a lower layer film containing the metal element on a surface of the substrate through a chemical vapor deposition process (plasma CVD process) by supplying the source gas and the reactant gas into a process container and plasmarizing a mixture gas of the source gas and the reactant gas, the substrate on which a film is to be formed being disposed inside the process container; and subsequently, laminating an upper layer film containing the metal element on the lower layer film by an atomic layer deposition process (plasma ALD process) which alternately performs an adsorption step of supplying the source gas into the process container to adsorb the source gas onto the surface of the substrate with the lower layer film formed thereon, and a reaction step of supplying the reactant gas into the process container and plasmarizing the reactant gas so that the plasmarized reactant gas reacts with the source gas adsorbed onto the surface of the substrate.

2. The film forming method of claim 1, wherein the act of forming the lower layer film is performed until the lower layer film has a predetermined thickness of 3 nm or less and subsequently, the act of laminating the upper layer film is performed.

3. The film forming method of claim 1, wherein the lower layer film and the upper layer film are metal films.

4. The film forming method of claim 1, wherein the source gas contains $TiCl_4$, and the reactant gas contains $H_2$.

5. The film forming method of claim 4, wherein the upper layer film and the lower layer film contain Ti.

* * * * *